(12) United States Patent
Xu et al.

(10) Patent No.: US 10,700,681 B1
(45) Date of Patent: Jun. 30, 2020

(54) PARALLELED POWER MODULE WITH ADDITIONAL EMITTER/SOURCE PATH

(71) Applicant: Ford Global Technologies, LLC, Dearborn, MI (US)

(72) Inventors: Fan Xu, Novi, MI (US); Lihua Chen, Farmington Hills, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 16/355,382

(22) Filed: Mar. 15, 2019

(51) Int. Cl.
 *H03K 17/687* (2006.01)
 *H03K 17/567* (2006.01)

(52) U.S. Cl.
 CPC ....... *H03K 17/6871* (2013.01); *H03K 17/567* (2013.01)

(58) Field of Classification Search
 CPC .. H03K 17/687; H03K 17/6871; H03K 17/56; H03K 17/567; H03K 17/6872; H03K 17/6874; H03K 17/145; H03K 17/122; H03K 17/168; H02M 1/088; H02M 1/08; H02M 1/32; H02M 7/537; H02M 7/003; H02M 7/44; H01F 17/04; H01F 38/14; H01F 7/0093

USPC .......................... 327/108, 109, 110, 111, 112
See application file for complete search history.

(56) References Cited

U.S. PATENT DOCUMENTS

| | | |
|---|---|---|
| 2018/0062634 A1 | 3/2018 | Shin |
| 2018/0183432 A1 | 6/2018 | Kondo |
| 2018/0302081 A1* | 10/2018 | Mao ..................... H03K 17/145 |

* cited by examiner

*Primary Examiner* — John W Poos
(74) *Attorney, Agent, or Firm* — David B. Kelley; Brooks Kushman P.C.

(57) ABSTRACT

Power electronics circuitry includes a pair of parallel switching elements. Each of the switching elements includes two power terminals, two control terminals, and an additional terminal. Corresponding ones of the two power terminals from each of the pair are connected via respective first and second power paths. Corresponding ones of the two control terminals from each of the pair are connected via respective first and second control paths. The additional terminals are connected via an additional path. The circuitry also includes a gate driver tapping the first and second control paths, and a magnet surrounding the additional terminals to couple inductance of the additional path.

18 Claims, 7 Drawing Sheets

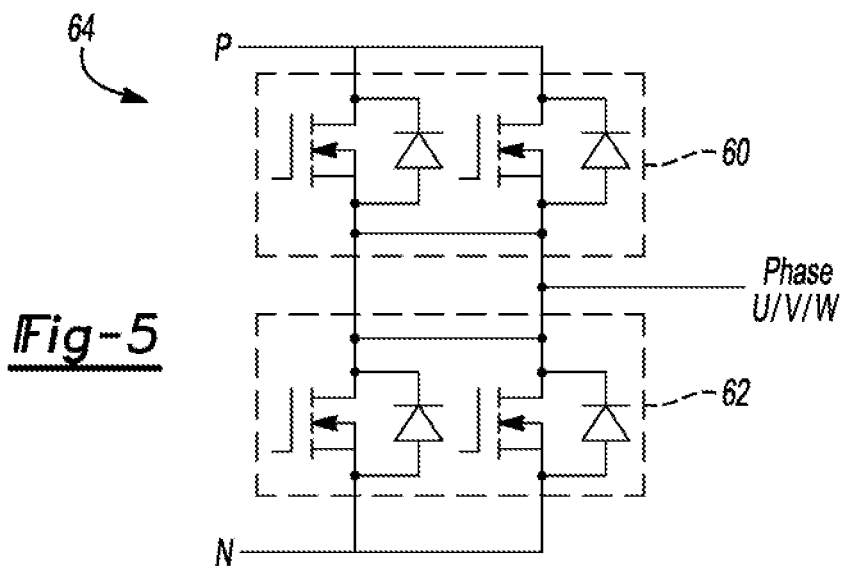
_Fig-5_
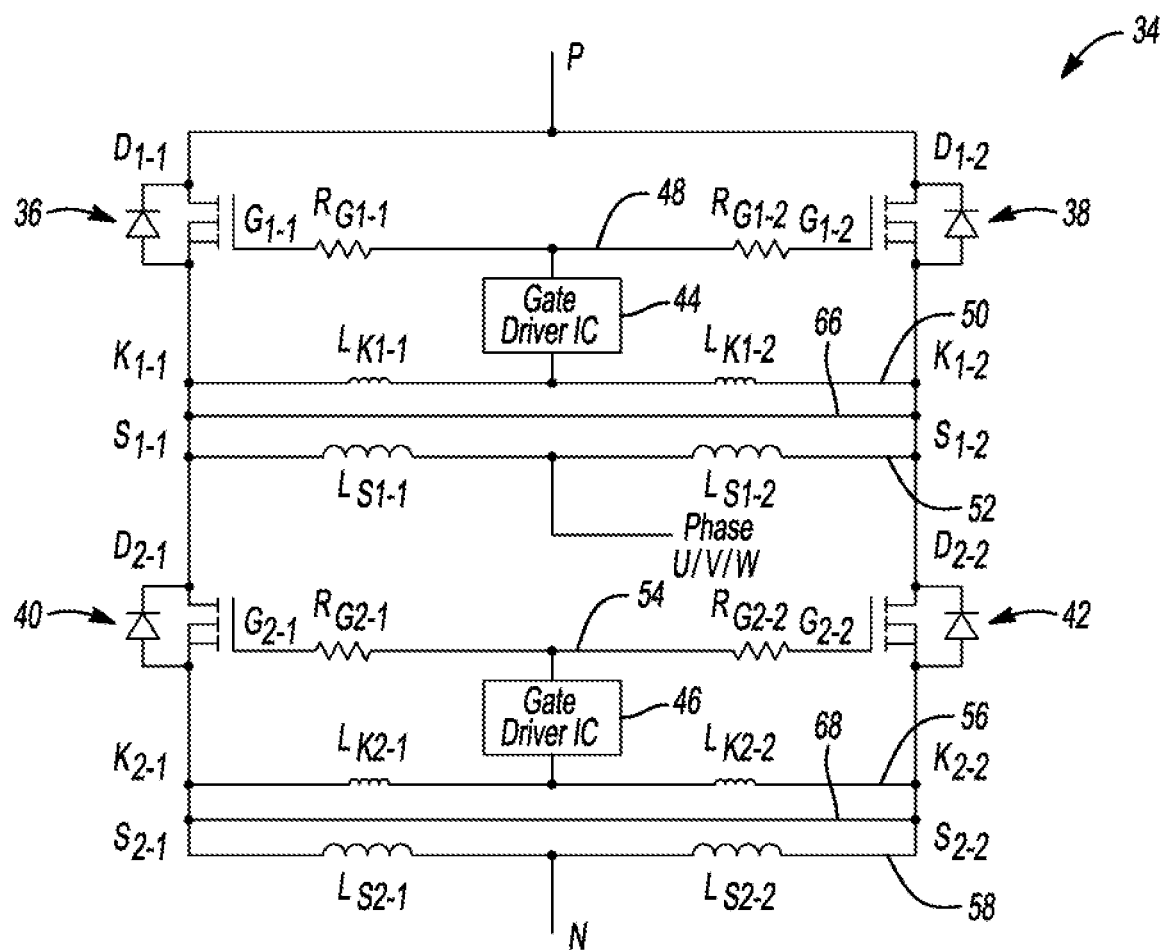
_Fig-6_

PARALLELED POWER MODULE WITH ADDITIONAL EMITTER/SOURCE PATH

TECHNICAL FIELD

This disclosure relates to power semiconductor devices.

BACKGROUND

Power semiconductors are used as switches or rectifiers in certain power electronics, such as switch-mode power supplies. They are also called power devices or, when used in integrated circuits, power integrated circuits (ICs). A power semiconductor is usually used in commutation mode (it is either on or off), and has a design optimized for such usage. Power semiconductors are found in systems delivering tens of milliwatts (e.g., a headphone amplifier) and in systems delivering a gigawatt (e.g., a high voltage direct current transmission line).

Certain metal-oxide-semiconductor field-effect transistors (MOSFETs), a type of power semiconductor, are depletion channel devices: Voltage, not current, may be necessary to create a conduction path from drain to source. At low frequencies, this can reduce gate current because it is only required to charge gate capacitance during switching. Switching times range from tens of nanoseconds to a few hundred microseconds. Typically, MOSFET devices are not bi-directional and are not reverse voltage blocking.

An insulated-gate bipolar transistor (IGBT), another type of power semiconductor, often has characteristics common to bipolar junction transistors (BJTs) and MOSFETs. It may have a high gate impedance and thus low gate current requirements like a MOSFET. It may have a low on state voltage drop in the operating mode like a BJT. Certain IGBTs can be used to block both positive and negative voltages, and have reduced input capacitance compared to MOSFET devices.

SUMMARY

Power electronics circuitry includes a pair of switching elements in parallel, each including a gate, a Kelvin source, a drain, and a source. The circuitry also includes a gate path connecting the gates, a Kelvin path connecting the Kelvin sources, a source path connecting the sources, and a gate driver tapping the gate and Kelvin paths and configured to drive the gates. The gate driver, gate path, and Kelvin path define portions of gate loops. The circuitry still further includes an additional path outside the gate loops in parallel with the Kelvin and source paths.

Power electronics circuitry includes a pair of parallel switching elements each including two power terminals, two control terminals, and an additional terminal. Corresponding ones of the two power terminals from each of the pair are connected via respective first and second power paths. Corresponding ones of the two control terminals from each of the pair are connected via respective first and second control paths. The additional terminals are connected via an additional path. The circuitry also includes a gate driver tapping the first and second control paths, and a magnet surrounding the additional terminals to couple inductance of the additional path.

Power electronics circuitry includes a pair of switching elements in parallel, each including a gate, a Kelvin emitter, a collector, and an emitter. The circuitry also includes a gate path connecting the gates, a Kelvin path connecting the Kelvin emitters, an emitter path connecting the emitters, and a gate driver, tapping the gate and Kelvin paths, configured to drive the gates. The gate driver, gate path, and Kelvin path define portions of gate loops. The circuitry still further includes an additional path outside the gate loops in parallel with the Kelvin and emitter paths.

BRIEF DESCRIPTION OF THE DRAWINGS

FIG. 5 is a schematic diagram of power module packaging for parallel semiconductors.

FIG. 6 is a schematic diagram of parallel half-bridge power modules with an additional emitter/source side path.

DETAILED DESCRIPTION

Various embodiments of the present disclosure are described herein. However, the disclosed embodiments are merely exemplary and other embodiments may take various and alternative forms that are not explicitly illustrated or described. The figures are not necessarily to scale; some features may be exaggerated or minimized to show details of particular components. Therefore, specific structural and functional details disclosed herein are not to be interpreted as limiting, but merely as a representative basis for teaching one of ordinary skill in the art to variously employ the present invention. As those of ordinary skill in the art will understand, various features illustrated and described with reference to any one of the figures may be combined with features illustrated in one or more other figures to produce embodiments that are not explicitly illustrated or described. The combinations of features illustrated provide representative embodiments for typical applications. However, various combinations and modifications of the features consistent with the teachings of this disclosure may be desired for particular applications or implementations.

Figure 1:
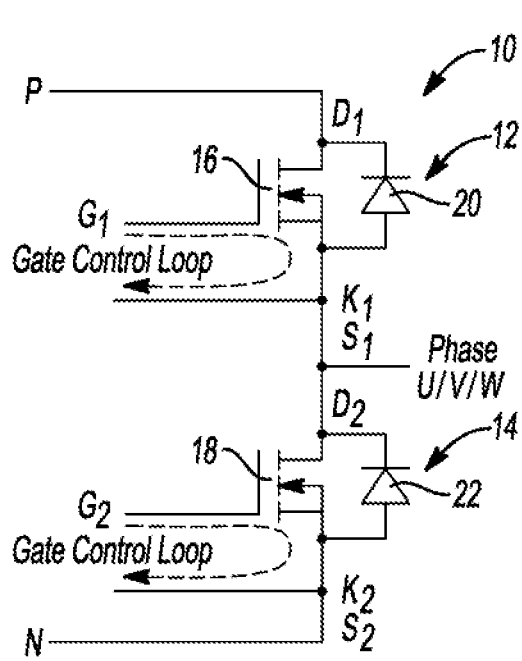
FIG. 1 is a schematic diagram of a half-bridge circuit.

Referring to FIG. 1, a half-bridge cell 10, which is a basic cell of power electronics circuitry/converter circuitry, includes upper switching element 12 and lower switching element 14. Each of the switching elements 12, 14 includes an active power device 16, 18 (e.g., a power silicon/silicon carbide MOSFET or silicon IGBT) with or without an anti-parallel diode 20, 22. Each of the switching elements 12, 14 also has two power terminals: drain ($D_n$) and source ($S_n$) for the MOSFET configuration (or collector ($C_n$) and emitter ($E_n$) for the IGBT configuration); and two control terminals: gate ($G_n$) and Kelvin source ($K_n$) for the MOSFET configuration (or Kelvin emitter for the IGBT configuration). Here, n is "1" when referring to the switching element 12 and "2" when referring to the switching element 14. The gate $G_n$ and Kelvin source/emitter $K_n$ terminals comprise the gate loop to control the active semiconductor turning on and off. The half-bridge cell positive DC terminal P and negative DC terminal N are connected to the drain terminal $D_1$ of the switching element 12 and the source terminal $S_2$ of the switching element 14 respectively. The mid-terminal of the half-bridge cell 10, which is also the source terminal $S_1$ of the switching element 12 and the drain terminal $D_2$ of the switching element 14, is connected to an output load (e.g. electric motor windings U/V/W).

A traction inverter in electric vehicles/hybrid electric vehicles usually includes one or several three-phase converters. In some topologies, there is also a boost DC-DC converter. For high-power traction inverter applications, several half-bridge cells need to be used in parallel to achieve the high output power. The power module packages a half-bridge cell due to its flexibility for various applications, different inverter topologies, and power ratings. As a result, several half-bridge power modules may be necessary in the traction inverter, depending on inverter topology and power rating.

Figure 2B:
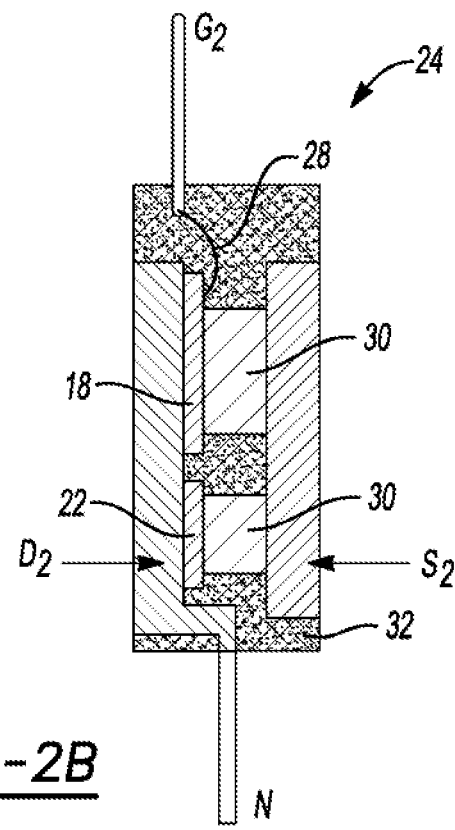
FIGS. 2A and 2B are a front and side view (in cross-section) of a half-bridge power module.
Figure 2A:
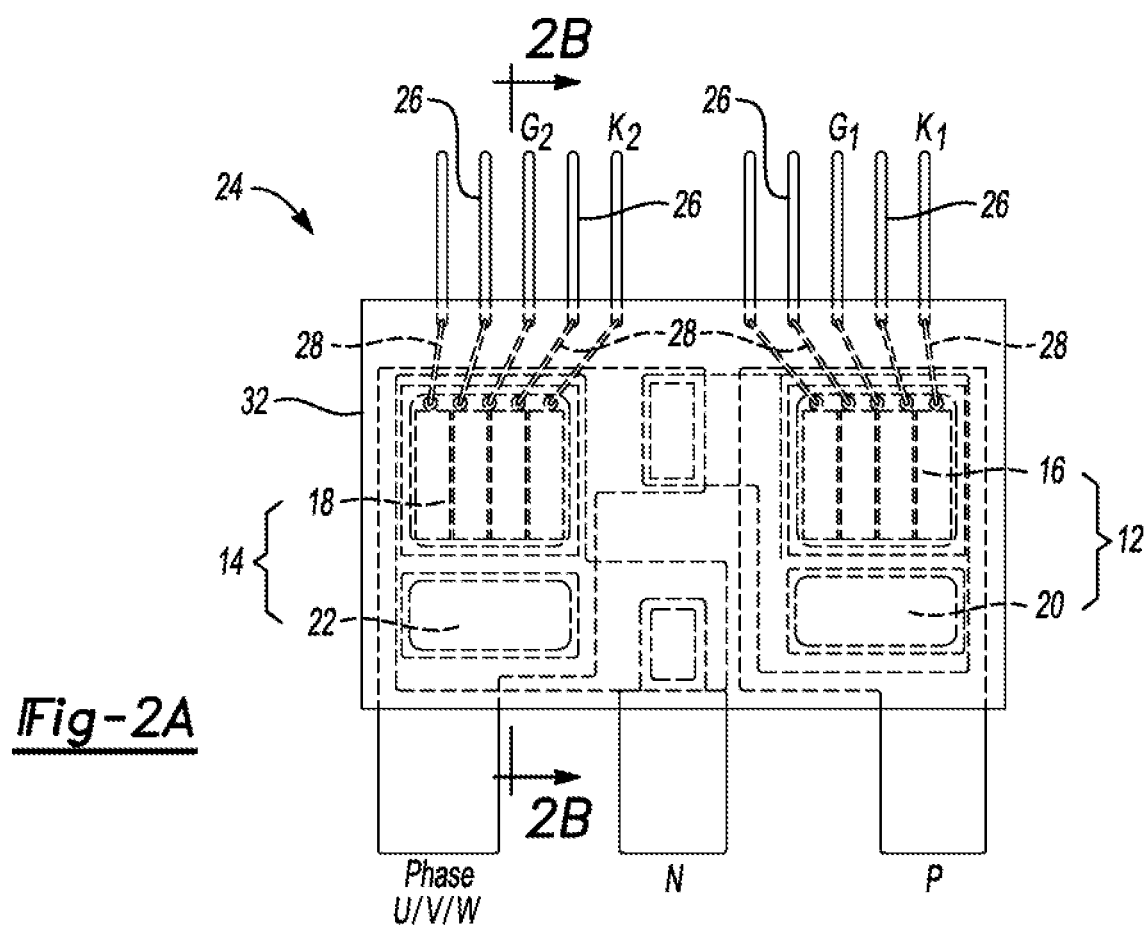

Referring to FIGS. 2A and 2B, the half-bridge cell 10 is shown within the context of a power module 24 in which the switching elements 12, 14 are soldered (or sintered) to copper leadframes on both top and bottom sides. The drain terminal $D_n$, source terminal $S_n$, external power terminals P, N, and mid-point phase output are part of the leadframes. Signal pins 26 are connected to the active power devices 12, 14 through wire bond 28 (or directly soldered/sintered to the semiconductor). The signal pins 26 include pins for the gates $G_n$ and Kelvin emitters/sources $K_n$, as well as some sensor signal outputs if there are on-chip sensors. Copper spacers 30 and epoxy 32 separate the drain terminal $D_n$, and source terminal $S_n$. The power module 24 can be cooled from either one side or two sides.

Figure 3:
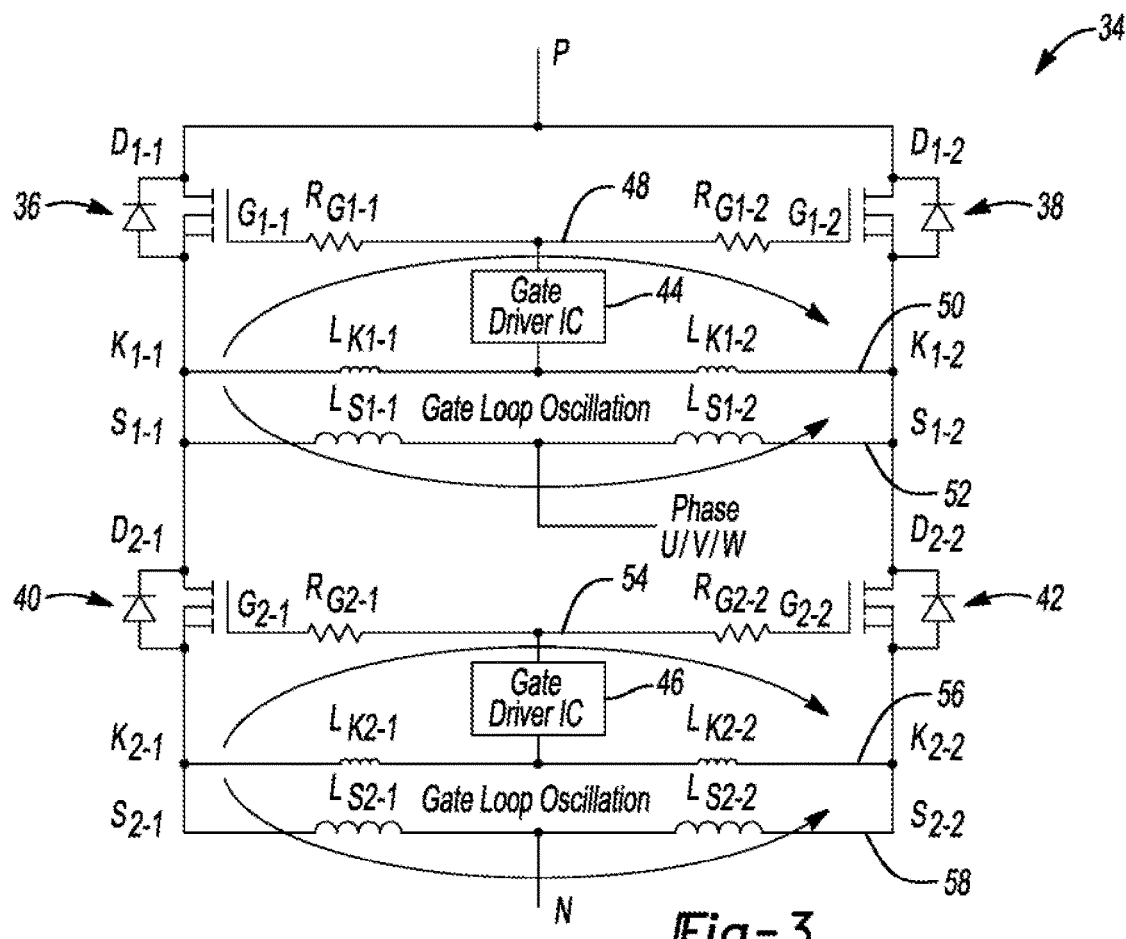
FIG. 3 is a schematic diagram of paralleled half-bridge power modules and resulting gate loop oscillations.

FIG. 3 shows a circuit 34 of parallel power switching elements 36, 38, 40, 42 each having two power terminals, drain $D_{x-y}$ and source $S_{x-y}$, and two control terminals, gate $G_{x-y}$ and Kelvin source, $KS_{x-y}$. Here, x is "1" when referring to the switching elements 36, 38 and "2" when referring to the switching elements 40, 42, and y is "1" when referring to the switching elements 36, 40, and "2" when referring to the switching elements 38, 42. (Within the context of IGBT technology, the power terminals would instead be collectors and emitters, and the control terminals would include Kelvin emitters rather than Kelvin sources.) The respective gates $G_{x-y}$ and Kelvin sources $KS_{x-y}$, comprise respective gate loops to control the power switching elements 36, 38, 40, 42. The circuit 34 also includes a gate driver integrated circuit 44 common to the switching elements 36, 38 and a gate driver integrated circuit 46 common to the switching elements 40, 42. A gate path 48 electrically connects the gates $G_{1-1}$, $G_{1-2}$, a Kelvin path 50 electrically connects that Kelvin sources, $KS_{1-1}$, $KS_{1-2}$, and a source path 52 electrically connects the sources $S_{1-1}$, $S_{1-2}$. Resistors $R_{G1-1}$, $R_{G1-2}$ are in the gate path 48. Likewise, a gate path 54 electrically connects that gates $G_{2-1}$, $G_{2-2}$, a Kelvin path 56 electrically connects that Kelvin sources, $KS_{2-1}$, $KS_{2-2}$, and a source path 58 electrically connects the sources $S_{2-1}$, $S_{2-2}$. Resistors $R_{G2-1}$, $R_{G2-2}$ are in the gate path 54. Various inductances $L_{Kx-y}$, $L_{Sx-y}$ are also shown. These are not actual elements but represent some of the inductances present in the circuit 34.

When half-bridge power modules are used in parallel for high power applications, the switching ON/OFF transient currents of parallel power semiconductors are usually unbalanced, due to the piece-to-piece variation of the power semiconductor parameters, non-uniform busbar layout, and/or unbalanced semiconductor junction capacitances and circuit stray inductances. The unbalanced currents cause the voltage potential difference of the emitter/source side of parallel semiconductors, i.e., $V_{K1-1}-V_{K1-2} \neq 0$, $V_{S1-1}-V_{S1-2} \neq 0$ (which should be zero all the time ideally). The voltage difference ($V_{K1-1}-V_{K1-2}$), with the semiconductor junction capacitance and the circuit stray inductance between $K_{1-1}$ and $K_{1-2}$ ($L_{K1-1}$, $L_{K1-2}$), and $S_{1-1}$ and $S_{1-2}$ ($L_{S1-1}$, $L_{S1-2}$), initiates the oscillation in gate loops of parallel semiconductors. The oscillation is uncontrollable and may cause oscillating gate voltage on semiconductors ($V_{G1-1}$, $K_{1-1}$, and $V_{G1-2}$, $K_{1-2}$) with high peak voltage values.

Figure 4:
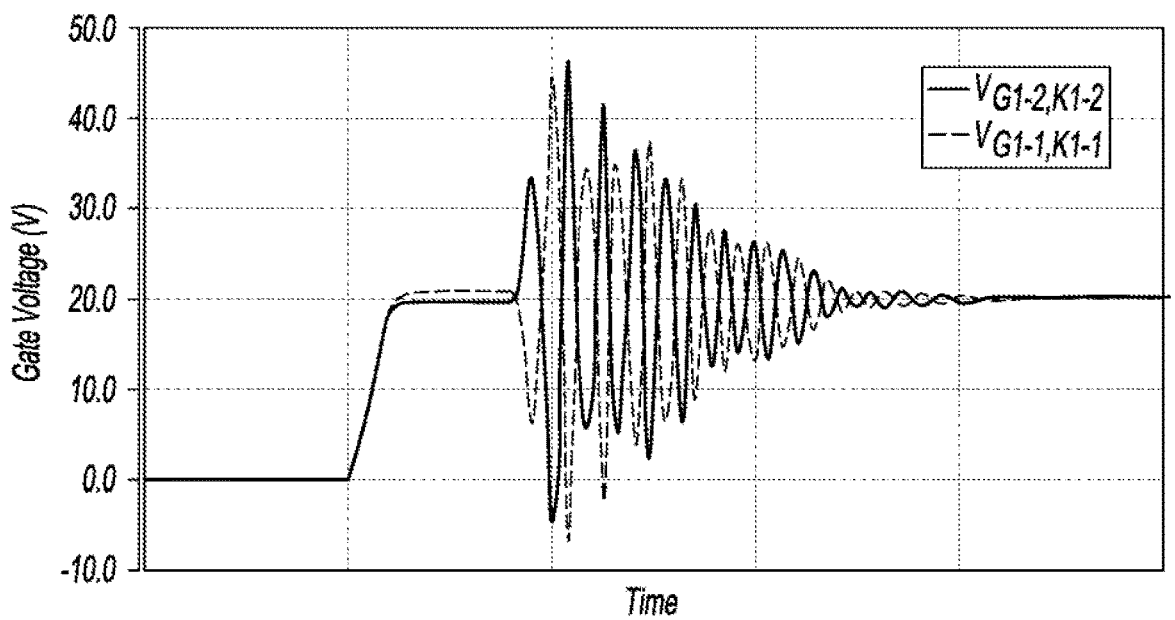
FIG. 4 is a plot of gate voltages associated with the paralleled half-bridge power modules of FIG. 3.

Referring to FIG. 4, simulation shows the oscillation gate voltage waveforms. The peak value of the gate voltage is close to 50V, which is much higher than gate driver output of 20V. Parallel silicon carbide MOSFETs, which switch much faster than silicon alone, are prone to the gate voltage oscillation unless the switching speed is reduced. Reduced switching speed, however, leads to higher switching loss.

Referring again to FIG. 3, the reduction of the stray inductance connecting the semiconductor emitter/source sides ($L_{K1-1}$, $L_{K1-2}$ and/or $L_{S1-1}$, $L_{S1-2}$) will reduce or eliminate the voltage potential difference of paralleled power modules, and effectively suppress the gate voltage oscillation. The stray inductance $L_{K1-1}$, $L_{K1-2}$ mainly comes from the power module signal pins, wire bond, and circuit trace on the gate drive printed circuit board. The inductance $L_{S1-1}$, $L_{S1-2}$ mainly comes from the terminals and the external busbars connecting parallel power modules. To achieve the purpose of reducing $L_{K1-1}$, $L_{K1-2}$ and/or $L_{S1-1}$, $L_{S1-2}$, the existing method is to package parallel semiconductors 60, 62 in one power module 64, as shown in FIG. 5. This method eliminates the external busbars connecting the parallel semiconductors 60, 62 and effectively reduces $L_{S1-1}$, $L_{S1-2}$ (FIG. 3). Relative to the half-bridge power module 24 in FIGS. 2A and 2B, this type of power module is not based on the basic circuit cell, i.e. half-bridge cell, so this type of power module is not flexible for different applications. In FIG. 5 for example, the parallel semiconductors 60, 62 may need to be designed differently. For different power rating traction inverters, the power module 64 may need to be redesigned to package different numbers of semiconductors. In addition, the busbar design and assembly process may also be complex.

To avoid gate voltage oscillation by reducing the emitter/source side stray inductance between parallel power semiconductors, we propose to add additional paths 66, 68 to the circuit 34 of FIG. 3 on the emitter/source of each of the power semiconductors 36, 38 and 40, 42 as shown in FIG. 6. The additional path 66 directly connects the $K_{1-1}/S_{1-1}$ side and the $K_{1-2}/S_{1-2}$ side. Similarly, the additional path 68 directly connects the $K_{2-1}/S_{2-1}$ side and the $K_{2-2}/S_{2-2}$ side. The additional paths 66, 68 are outside the gate loops and can be designed to be physically short with small stray inductance.

Figure 7A:
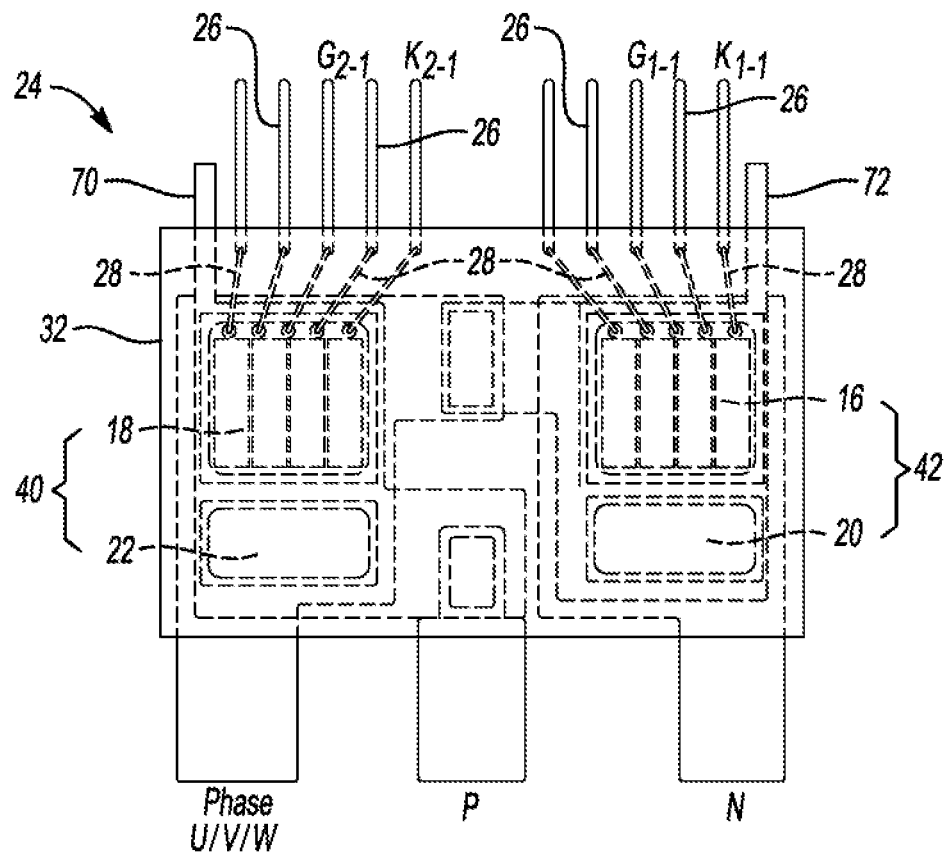
FIGS. 7A and 7B are front and side views respectively of a half-bridge power module with an extended emitter/source leadframe terminal, and an additional emitter/source path.
Figure 7B:
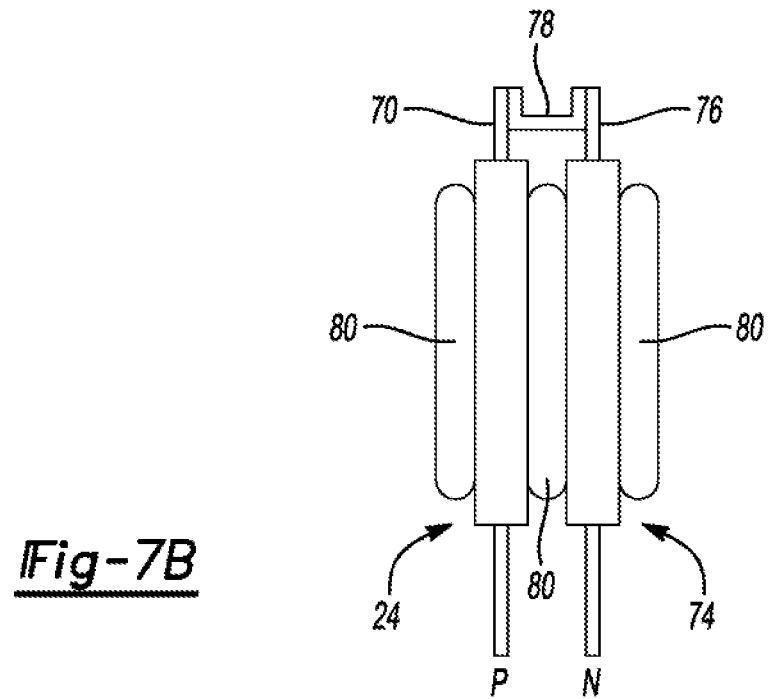

FIG. 7A shows an example design implementing the proposed additional paths within the context of the power module described in FIGS. 2A and 2B. The added emitter/source side path proposed in FIG. 6 is achieved by extending semiconductor emitter/source copper leadframes 70, 72. FIG. 7B shows the power module 24 of FIG. 7A attached with a corresponding power module 74 (of design similar to the power module 24 of FIG. 7A). The extended semiconductor emitter/source copper leadframe 70 and a corresponding extended semiconductor emitter/source leadframe 76 of the power module 74 are connected via a busbar 78 of minimal length to reduce stray inductance. With small stray inductance, the voltage potential difference between the associated Kelvin sources and sources (see, for example, $K_{1-1}$ and $K_{1-2}$, and $S_{1-1}$ and $S_{1-2}$ of FIG. 6) will be kept small even during fast transient switching. As the result, gate loop oscillation and gate degradation can be avoided when power semiconductors are operated in parallel. At the same time, the half-bridge power module structure can be used for the flexible and easy design/assembly for different vehicle applications. Cooling channels 80 are also shown adjacent to the power modules 24, 74.

Figure 8:
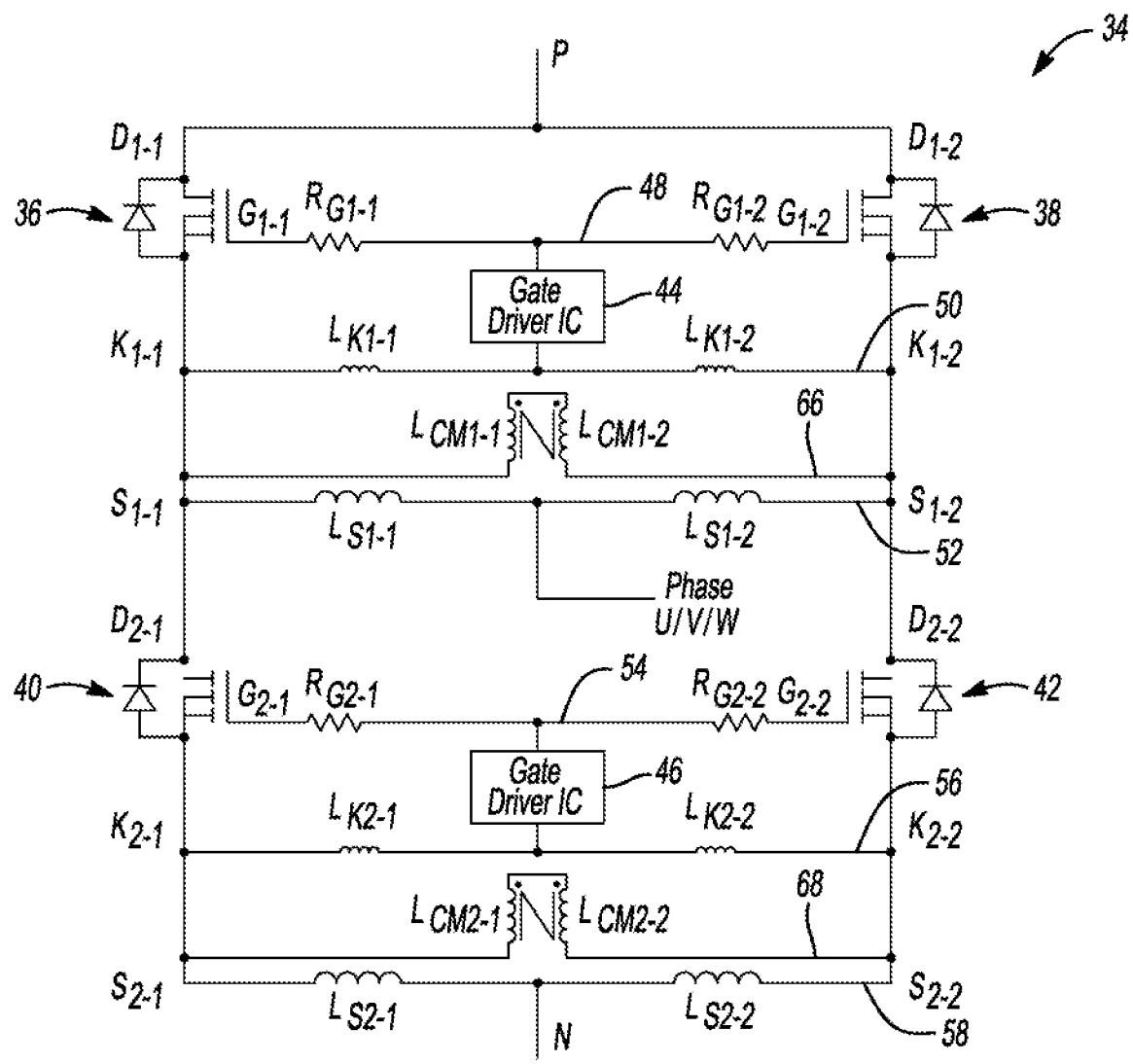
FIG. 8 is a schematic diagram of parallel half-bridge power modules with coupled stray inductances on the additional emitter/source side path.

To further reduce the stray inductance in the added emitter/source paths 66, 68, another design is proposed that couples the stray inductance in the added emitter/source paths 66, 68 as shown in FIG. 8. Through the coupling, the equivalent impedance between power semiconductors can be reduced. If the Kelvin emitter/source path inductance (e.g., $L_{K1-1}$ and $L_{K1-2}$) is coupled, the impedance of each semiconductor gate loop will be increased, which increases the switching time and loss. If the phase output path inductances (e.g., $L_{S1-1}$ and $L_{S1-2}$) are coupled, the output power current will saturate the coupling magnets. Coupling the stray inductance $L_{CM1-1}$ and $L_{CM1-2}$ in the additional path will not impact the gate loops or power output. By coupling $L_{CM1-1}$ and $L_{CM1-2}$ to be the common-mode (CM) structure, the voltage potential difference between $K_{1-1}$ and $K_{1-2}$ (and between $S_{1-1}$ and $S_{1-2}$), which is the differential mode voltage, can also be reduced or eliminated.

Figure 9A:
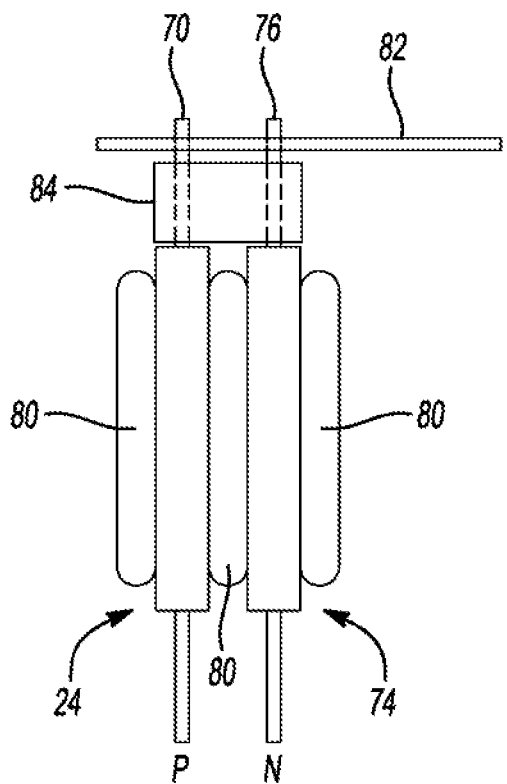
FIGS. 9A and 9B are side and top views respectively of parallel half-bridge power modules with coupled stray inductances on the additional emitter/source side path implemented by extended leadframes.
Figure 9B:
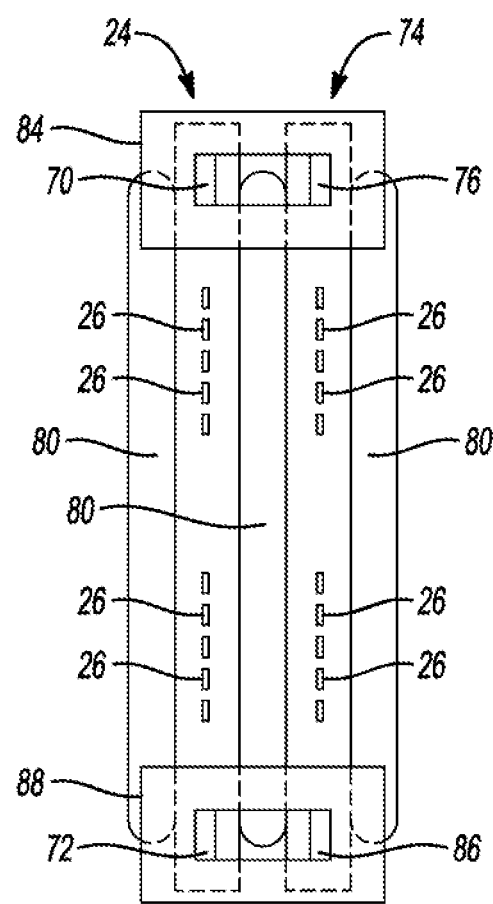

Referring to FIGS. 9A and 9B, the extended emitter/source leadframe terminals 70, 76, like the signal pins 26, can be soldered to a gate drive printed circuit board (PCB) 82 to implement the coupling of stray inductances $L_{CM1-1}$, $L_{CM1-2}$ (and $L_{CM2-1}$, $L_{CM2-2}$). Through PCB traces, the extended emitter/source leadframe terminals 70, 76 can be connected, and then the additional emitter/source path is established. Most of the stray inductance in this added path ($L_{CM1-1}$, $L_{CM1-2}$) is on the extended terminal. The inductance on PCB traces and internal leadframes is usually negligible. A magnet 84 is applied on the added emitter/source terminals 70, 76 to achieve the CM structure. The power module 74 further includes an extended emitter/source leadframe terminal 86. Thus, a magnet 88 is applied on the added emitter/source terminals 72, 86.

Figure 10B:
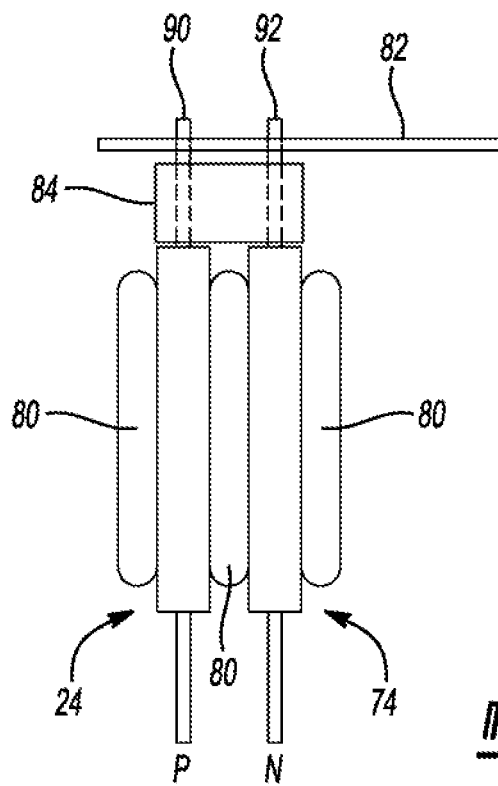
FIGS. 10A and 10B are front and side views respectively of parallel half-bridge power modules with coupled stray inductances on the additional emitter/source side path implemented by pins and wire bond.
Figure 10A:
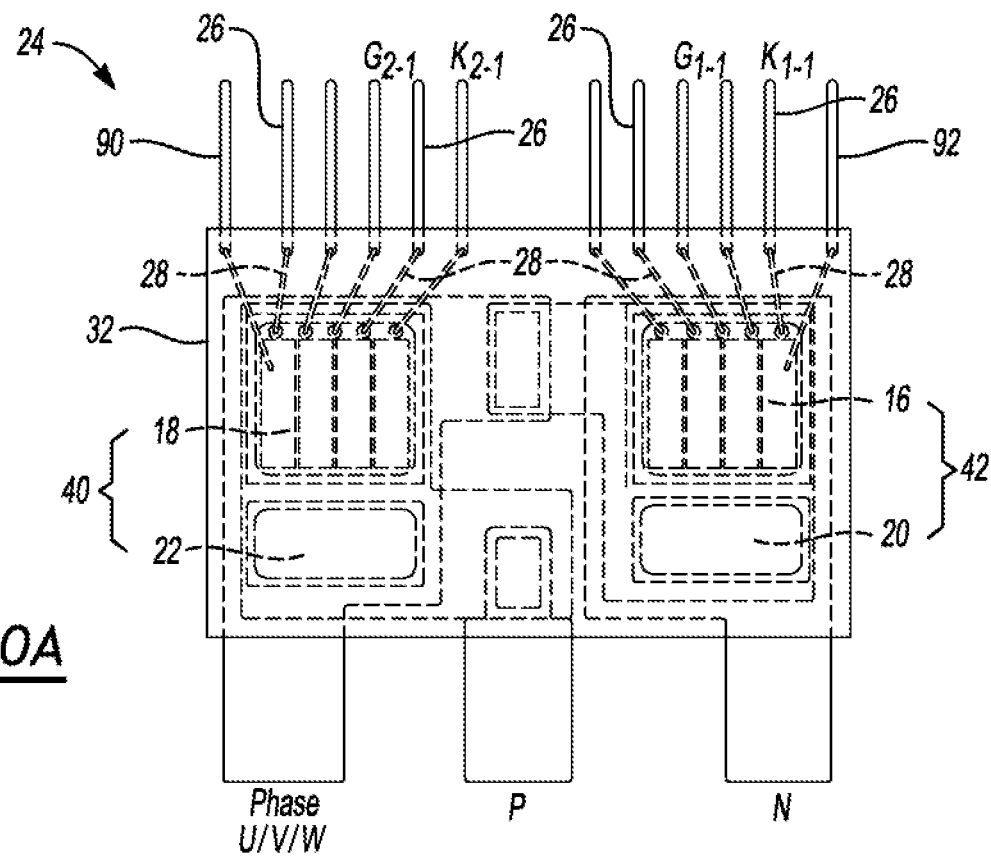

The proposed additional emitter/source path can also be implemented by wire bond and signal pins. FIG. 10A shows such an example within the context of the power module described in FIGS. 2A and 2B. Signal pins 92, 92 are respectively added and connected to the power semiconductor emitter/source sides for the switching elements 12, 14. These additional pins are also connected through PCB traces.

Figure 11:
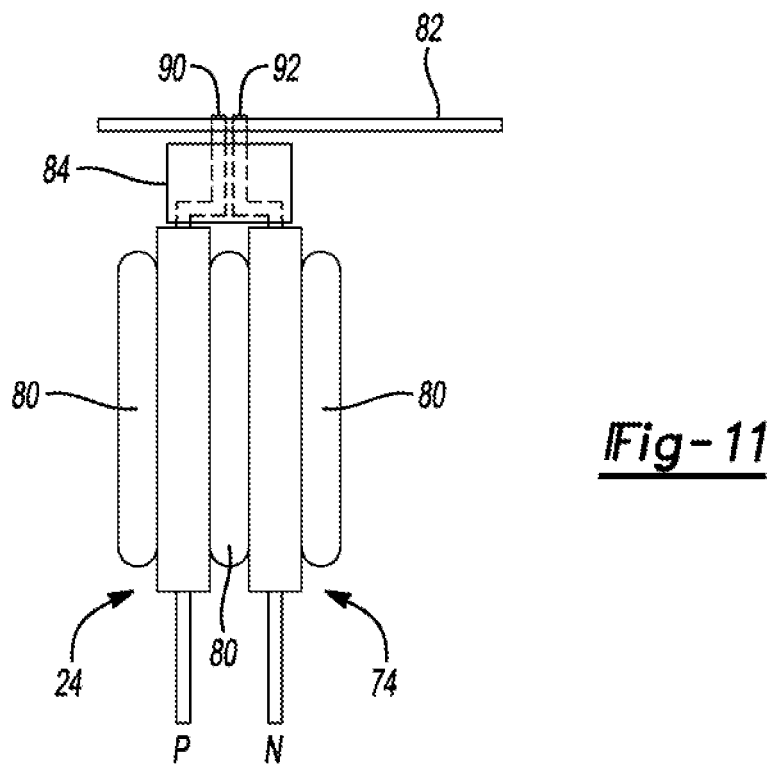
FIG. 11 is a side view of a parallel half-bridge power module with coupled stray inductance on the additional emitter/source side path implemented by bent pins and wire bond.

To further improve the coupling effects and reduce the equivalent inductance in the added paths, a third alternative is shown in FIG. 11. The additional emitter/source leadframe terminals (FIG. 9) or pins (FIG. 10) are bent and located close to each other.

Thus, we propose an additional emitter/source side path for paralleled half-bridge power modules. Possible advantages of some of the designs contemplated herein are as follows. Gate loop oscillation can be avoided when power semiconductors are operated in parallel with fast switching speed. The half-bridge power module structure is not significantly changed, and the power module is still flexible for different traction inverter topologies and power ratings in vehicles. Only a small change on the power module design, and a short busbar or a magnet may be added. Additional costs should be minimized. Certain proposed designs can be achieved during power module and traction inverter assembly. Normal functions of the traction inverter, such as the inverter phase output and power semiconductor gate drive, will not be impacted. Proposed arrangements can be applied in different types of half-bridge power modules (single or double-side cooled power modules, power modules using wire bond or leadframe as chip top surface connection, etc.)

The words used in the specification are words of description rather than limitation, and it is understood that various changes may be made without departing from the spirit and scope of the disclosure and claims. As previously described, the features of various embodiments may be combined to form further embodiments that may not be explicitly described or illustrated. While various embodiments may have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes include, but are not limited to cost, strength, durability, life cycle cost, marketability, appearance, packaging, size, serviceability, weight, manufacturability, ease of assembly, etc. As such, embodiments appearing to be less desirable than other embodiments or prior art implementations with respect to one or more characteristics are not outside the scope of the disclosure and may be desirable for particular applications.

What is claimed is:

1. Power electronics circuitry comprising:
   a pair of switching elements in parallel, each including a gate, a Kelvin source, a drain, and a source;
   a gate path connecting the gates;
   a Kelvin path connecting the Kelvin sources;
   a source path connecting the sources;
   a gate driver tapping the gate and Kelvin paths and configured to drive the gates, wherein the gate driver, gate path, and Kelvin path define portions of gate loops;
   an additional path outside the gate loops in parallel with the Kelvin and source paths; and
   a magnet surrounding terminals of the additional path to couple inductance of the additional path.

2. The power electronics circuitry of claim 1, wherein a bus bar partially defines a portion of the additional path.

3. The power electronics circuitry of claim 1, wherein the pair, gate driver, and paths define portions of a half-bridge cell.

4. The power electronics circuitry of claim 3, wherein the source path is a mid-terminal of the half-bridge cell.

5. The power electronics circuitry of claim 4 further comprising a U/V/W phase tapping the source path.

6. The power electronic circuitry of claim 1 further comprising a DC terminal tapping the source path.

7. The power electronic circuitry of claim 1, wherein each of the switching elements includes an anti-parallel diode.

8. Power electronics circuitry comprising:
   a pair of parallel switching elements each including two power terminals, two control terminals, and an additional terminal, corresponding ones of the two power terminals from each of the pair being connected via respective first and second power paths, corresponding ones of the two control terminals from each of the pair being connected via respective first and second control paths, and the additional terminals being connected via an additional path;

a gate driver tapping the first and second control paths, and a magnet surrounding the additional terminals to couple inductance of the additional path.

9. The power electronics circuitry of claim 8, wherein the switching elements are metal-oxide-semiconductor field-effect transistors.

10. The power electronics circuitry of claim 8, wherein the switching elements are insulated-gate bipolar transistors.

11. The power electronic circuitry of claim 8, wherein a bus bar defines a portion of the additional path.

12. The power electronics circuitry of claim 8, wherein the additional terminals are bent toward each other.

13. Power electronics circuitry comprising:
a pair of switching elements in parallel, each including a gate, a Kelvin emitter, a collector, and an emitter;
a gate path connecting the gates;
a Kelvin path connecting the Kelvin emitters;
an emitter path connecting the emitters;
a gate driver, tapping the gate and Kelvin paths, configured to drive the gates, wherein the gate driver, gate path, and Kelvin path define portions of gate loops; and
an additional path outside the gate loops in parallel with the Kelvin and emitter paths, wherein the pair, gate driver, and paths define portions of a half-bridge cell.

14. The power electronics circuitry of claim 13 further comprising a magnet surrounding terminals of the additional path to couple inductance of the additional path.

15. The power electronics circuitry of claim 13, wherein a bus bar partially defines the additional path.

16. The power electronics circuitry of claim 13, wherein the emitter path is a mid-terminal of the half-bridge cell.

17. The power electronics circuitry of claim 16 further comprising a U/V/W phase tapping the emitter path.

18. The power electronic circuitry of claim 13 further comprising a DC terminal tapping the emitter path.

* * * * *